United States Patent
Ogawa et al.

(10) Patent No.: US 7,728,347 B2
(45) Date of Patent: Jun. 1, 2010

(54) ZNO LAYER AND SEMICONDUCTOR LIGHT EMITTING DEVICE

(75) Inventors: Akio Ogawa, Yamato (JP); Michihiro Sano, Odawara (JP); Hiroyuki Kato, Yokohama (JP); Hiroshi Kotani, Yokohama (JP); Tomofumi Yamamuro, Kawasaki (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 12/428,567

(22) Filed: Apr. 23, 2009

(65) Prior Publication Data

US 2009/0236598 A1 Sep. 24, 2009

Related U.S. Application Data

(63) Continuation of application No. PCT/JP2007/001146, filed on Oct. 22, 2007.

(30) Foreign Application Priority Data

Oct. 25, 2006 (JP) ............... 2006-289469

(51) Int. Cl.
*H01L 29/24* (2006.01)
*H01L 33/00* (2006.01)
*H01L 21/20* (2006.01)
*H01L 21/36* (2006.01)
*H01L 21/04* (2006.01)

(52) U.S. Cl. ............... 257/102; 257/101; 257/103; 257/E21.001; 257/E21.002; 257/E33.003; 257/E33.022; 438/478; 438/510; 438/914; 438/918

(58) Field of Classification Search ......... 257/101–103, 257/E21.001, E21.002, E33.003, E33.022; 438/478, 510, 914, 918

See application file for complete search history.

(56) References Cited

U.S. PATENT DOCUMENTS

| 4,181,627 | A | * | 1/1980 | Weiher et al. ......... 252/301.6 R |
| 4,219,608 | A | * | 8/1980 | Nishiyama et al. ......... 428/432 |
| 2006/0001031 | A1 | * | 1/2006 | Ichinose et al. ............. 257/79 |
| 2007/0145499 | A1 | * | 6/2007 | Sugibuchi et al. .......... 257/414 |
| 2008/0056984 | A1 | * | 3/2008 | Yoshioka et al. ........... 423/622 |
| 2008/0230800 | A1 | * | 9/2008 | Bandoh et al. ............. 257/103 |

FOREIGN PATENT DOCUMENTS

| JP | 2003-104792 A | 4/2003 |
| JP | 2004-296459 A | 10/2004 |
| JP | 2005-268196 A | 9/2005 |
| WO | WO 2005-076373 A1 | 8/2005 |

OTHER PUBLICATIONS

International Search Report dated Nov. 20, 2007 (10 pages), with partial English translation of the Written Opinion of the International Searching Authority (3 pages), issued in counterpart International Application Serial No. PCT/JP2007/001146.

* cited by examiner

*Primary Examiner*—Ida M Soward
(74) *Attorney, Agent, or Firm*—Frishauf, Holtz, Goodman & Chick, P.C.

(57) ABSTRACT

A ZnO layer is provided which can obtain emission at a wavelength longer than blue (e.g., 420 nm) and has a novel structure. A transition energy narrower by 0.6 eV or larger than a band gap of ZnO can be obtained by doping S into a ZnO layer.

9 Claims, 8 Drawing Sheets

US 7,728,347 B2

ZNO LAYER AND SEMICONDUCTOR LIGHT EMITTING DEVICE

CROSS REFERENCE TO RELATED APPLICATION

This application is a continuation application of international application, PCT/JP2007/001146 filed on Oct. 22, 2007, the contents of which are herein incorporated by reference.

BACKGROUND OF THE INVENTION

A) Field of the Invention

The present invention relates to a ZnO layer and a semiconductor light emitting device, and more particularly to a ZnO layer suitable for particularly green light emission and a semiconductor light emitting device.

B) Description of the Related Art

Main trends of green light emitting diodes (LED) presently in practical use are $In_xGa_{1-x}N$-containing LED and GaP-containing LED.

An $In_xGa_{1-x}N$-containing LED is formed, for example, on a sapphire substrate. For example, sequentially formed on a (0001) polar plane of a sapphire substrate are a buffer layer, an n-type GaN contact layer, an InGaN emission layer, a p-type GaN clad layer and a p-type GaN contact layer. Green emission can be obtained by changing an In composition of an $In_xGa_{1-x}N$ in the InGaN emission layer.

For a GaP-containing LED, green emission (Eg: 2.25 eV to 2.45 eV) can be obtained by using $Ga_{1-x}Al_xP$ semiconductor material. However, this LED is not practical because emission is indirect transition and an emission intensity is weak. An emission efficiency can be increased by doping luminescent centers substituting group V and called isoelectronic traps, into GaP. If N is selected as isoelectronic traps, yellow-green emission occurs at a wavelength of 565 nm.

A high emission efficiency at an external quantum efficiency of about 50% can be obtained for a blue $In_xGa_{1-x}N$ LED. However, such a high quantum efficiency can only be obtained in a range from ultraviolet in a 360 nm range to blue in a 460 nm range, and in the longer wavelength range, an efficiency is lowered considerably. For example, green in a 530 nm range has an efficiency about a half that of blue. Improving an efficiency of a green LED is important when considering applications to a liquid crystal display using as backlight, LED's of three primary colors: blue of InGaN-containing LED, green of InGaN-containing LED, and red of AlGaInP-containing LED.

An efficiency of a green LED is lowered by a phenomenon which occurs when a mixed crystal In component of $In_xGa_{1-x}N$ to be used as the material of the emission layer is increased. By using $In_xGa_{1-x}N$ mixed crystal as the material of the emission layer, blue emission at a wavelength of about 470 nm is obtained at an In composition of about 20%, and green emission at a wavelength of about 520 nm is obtained at an In composition of about 35%. However, at an In composition of 20% or higher, phase separation occurs. Green emission characteristics are degraded by phase separation.

In the LED structure described above, since the $In_xGa_{1-x}N$ emission layer is thin, this layer grows lattice matching the relatively thick n-type GaN contact layer The $In_xGa_{1-x}N$ layer is therefore formed containing strain in crystal. $In_xGa_{1-x}N$ having a high mixed crystal In composition has a much larger lattice constant than that of GaN. Therefore, compression strain is contained in crystal of the $In_xGa_{1-x}N$ emission layer lattice matching the GaN contact layer. Because of compression strain, a piezo electric field is generated in the $In_xGa_{1-x}N$ layer so that carriers (electrons and holes) in crystal are spatially separated and a recombination probability lowers. This results in a lowered internal quantum efficiency of LED. Furthermore, as a device generating a piezo electric field is driven, a drive current increases and emission color shifts to the shorter wavelength side.

FIG. 8 illustrates a band diagram of a double hetero structure of GaAlP/Gap/GaAlP of a GaP-containing LED. Heterojunction of GaP/$Ga_{1-x}Al_xP$ has a type II structure. Therefore, a GaP-containing LED having a double hetero structure or a quantum well structure cannot confine carriers in an emission layer. It is therefore difficult to improve the emission characteristics. A conventional light emitting diode has therefore homojunction and its emission efficiency is low. An LED having N isoelectronic traps in GaP has homojunction and an emission efficiency of several %, and renders yellow-green emission at a wavelength of 565 nm to 570 nm.

JP-A-2004-296459 discloses a light emitting device using ZnO doped with Se or S as the material of an emission layer. It describes that this light emitting device renders blue emission at 420 nm (e.g., refer to paragraph [0090]). It also describes that the light emitting device has an emission wavelength of 370 nm to 440 nm depending upon a concentration of Se or S (e.g., refer to paragraphs [0077] and [0091]).

SUMMARY OF THE INVENTION

An object of the present invention is to provide a ZnO layer having a novel structure capable of having an emission peak wavelength of blue (e.g., 420 nm) or longer, and a semiconductor light emitting device having this ZnO layer as an emission layer.

Another object of the present invention is to provide a ZnO layer capable of having an emission peak wavelength of green (e.g., blue-green at a wavelength of 500 nm), and a semiconductor light emitting device having this ZnO layer as an emission layer.

According to one aspect of the present invention, there is provided a ZnO single crystal layer doped with S at a concentration of 0.1 atom % or smaller and having an emission peak wavelength in a measured photoluminescence spectrum in a range of 490 nm or longer and 510 nm or shorter.

According to another aspect of the present invention, there is provided a semiconductor light emitting device comprising: a first semiconductor layer of a first conductivity type; a second semiconductor layer of a second conductivity type opposite to the first conductivity type; an emission layer sandwiched between the first and second semiconductor layers, the emission layer including a ZnO single crystal layer doped with S at a concentration of 0.1 atom % or smaller and having an emission peak wavelength in a measured photoluminescence spectrum in a range of 490 nm or longer and 510 nm or shorter; a first electrode electrically connected to the first semiconductor layer; and a second electrode electrically connected to the second semiconductor layer.

DESCRIPTION OF THE PREFERRED EMBODIMENTS

Figure 1:
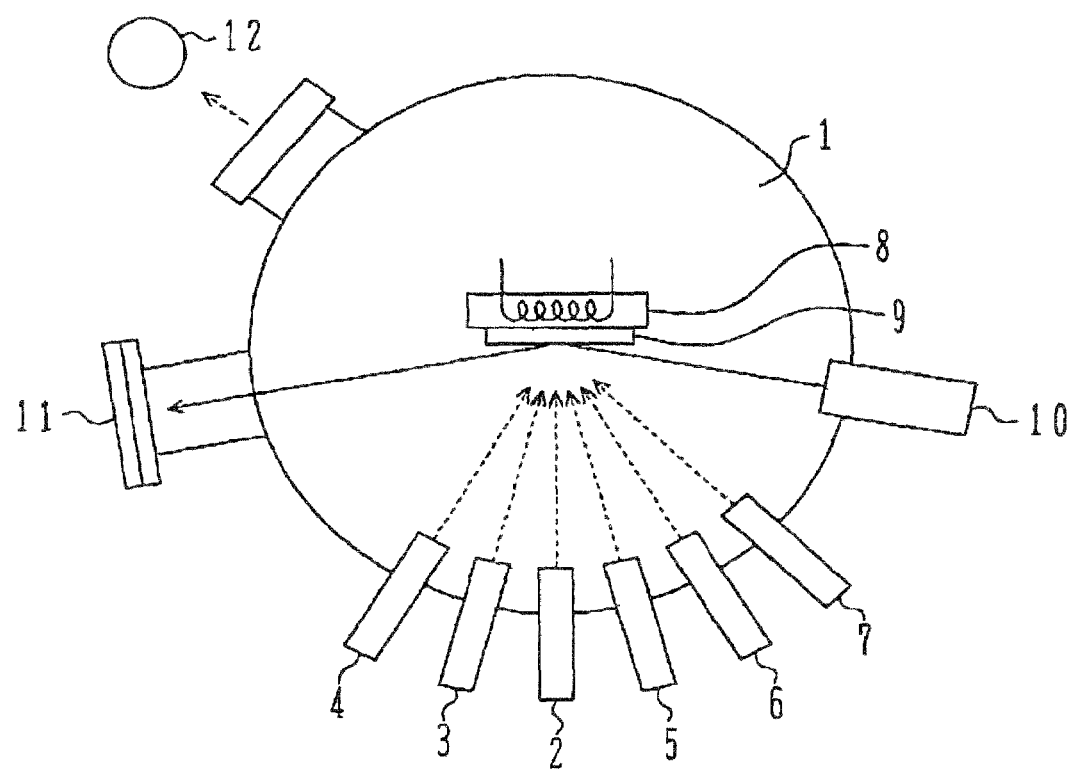
FIG. 1 is a schematic diagram illustrating a film forming system for forming a ZnO layer according to a first embodiment.

First, with reference to FIG. 1, description will be made on a ZnO layer growing method according to the first embodiment of the present invention (a method of growing a ZnO layer while radiating sulfur (S)). FIG. 1 is a schematic diagram of a film forming system. Molecular beam epitaxy (MBE) is used as the film forming method.

A substrate heater 8 is disposed in an ultra high vacuum chamber 1, and a substrate 9 to be used as an underlying layer for crystal growth is held by the substrate heater 8. The substrate 9 may be a sapphire ($Al_2O_3$) substrate, an SiC substrate, a GaN substrate, a ZnO substrate or the like. In order to form a ZnO layer having good crystallinity, a substrate having less lattice matching is preferable. It is therefore most preferable to use a ZnO substrate.

A ZnO substrate can be used having any one of a +c plane, a −c plane, an plane and an m plane (A ZnO layer can be grown on any one of the +c plane, −c plane, a plane and m plane). Description will continue assuming that a ZnO layer is grown on a +c plane of a ZnO substrate.

The ultra high vacuum chamber 1 is equipped with a Zn source gun 2, an O source gun 3, a ZnS source gun 4, an Mg source fun 5, an N source gun 6 and a Ga source gun 7. The Zn source gun 2, ZnS source gun 4, Mg source gun 5 and Ga source gun 7 have Knudsen cells for accommodating Zn, ZnS, Mg and Ga solid sources, and eject Zn, ZnS, Mg and Ga beams, respectively.

The O source gun 3 and N source gun 6 have each an electrodeless discharge tube using a high frequency wave (e.g., 13.56 MHz). The O source gun 3 and N source gun 6 make oxygen gas and nitrogen gas radical in the electrodeless discharge tubes, and eject an O radical beam and an N radical beam, respectively. Beams ejected from respective source guns can be supplied to the substrate 9 at the same time to grow a ZnO layer having a desired composition.

A reflection high energy electron diffraction (RHEED) gun 10 and a screen 11 for displaying a RHEED image are mounted on the ultra high vacuum chamber 1. Flatness of a grown ZnO layer is evaluated from an RHEED image. A vacuum pump 12 evacuates the inside of the ultra high vacuum chamber 1. Ultra high vacuum is vacuum having a pressure of $1\times10^{-7}$ Torr or lower.

Description will be made on a ZnO layer growing method. First, a washed substrate 9 is held by the substrate heater 8, the substrate surface is cleaned further by thermal annealing. For example, thermal annealing is performed for 30 minutes at 900° C. in high vacuum of $1\times10^{-9}$ Torr.

Next, a Zn beam, an O radical beam and a ZnS beam are radiated at the same time to the substrate 9 subjected to thermal annealing, to grow a ZnO layer. For example, a temperature of the substrate surface is set to 700° C. and a ZnO layer is grown to a thickness of 1 μm.

A Zn beam is radiated, for example, by using Zn of 7N purity as a solid source and at a beam amount of $1\times10^{15}$ atoms/$cm^2$s. An O radical beam is radiated, for example, by introducing pure oxygen gas of 6N purity into the electrodeless discharge tube at 1 sccm to make the oxygen gas radical, and at a beam amount of $3\times10^{-5}$ Torr. A ZnS beam is radiated, for example, by using single crystal ZnS of 5N purity as a solid source and at a beam amount of $5\times10^{14}$ atoms/$cm^2$s. With this growth method, a ZnO layer can be formed which is transparent and has good flatness.

Instead of a ZnS source gun, an S source gun using only S as a solid source may be used. Sulfurate compound such as $H_2S$ may be used as a sulfur source.

Next, with reference to FIG. 2, description will be made on experiments of measuring a photoluminescence (PL) spectrum of a ZnO layer formed by the above-described growth method. As a comparative example, a sample of a ZnO layer was formed which was grown at the same substrate temperature of 700° C. without radiating a ZnO beam, and a PL spectrum of the comparative example was also measured.

A PL spectrum was measured by radiating He—Cd laser (output 2 mW) at a wavelength of 325 nm to the ZnO layer and measuring an emission spectrum obtained through spectroscopy of photoluminescence light with a photomultiplier. Composition analysis through energy dispersive X-ray (EDX) spectroscopy was conducted for the samples of both the embodiment and comparative example.

Figure 2:
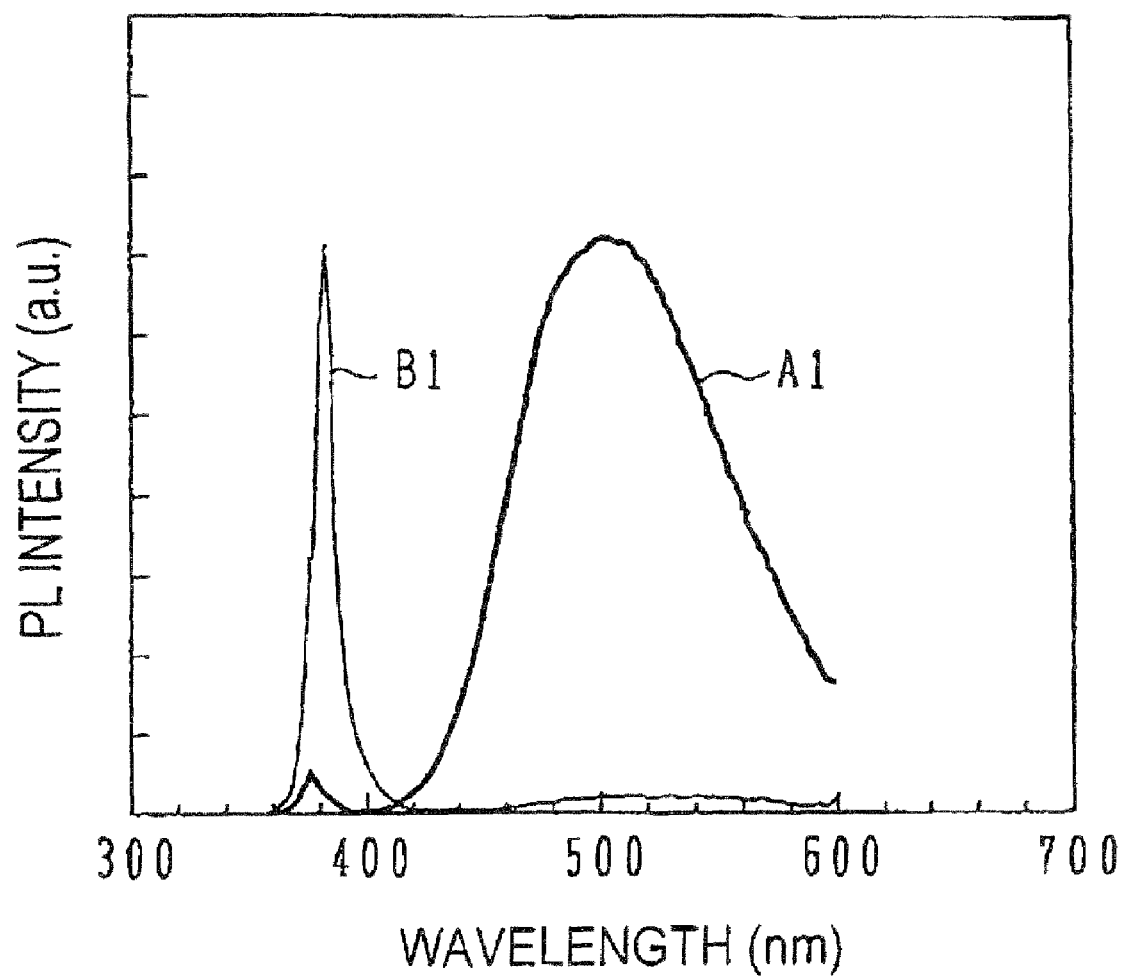
FIG. 2 is a graph representing PL spectra of ZnO layers according to the first embodiment and a comparative example.

FIG. 2 illustrates PL spectra of both the embodiment and comparative example. An abscissa of the graph represents a wavelength in the unit of nm, and an ordinate represents an intensity of photoluminescence in an arbitrary unit. A curve A1 indicates a spectrum of the embodiment, and a curve B1 represents a spectrum of the comparative example.

The spectrum of the comparative example indicates that an emission peak wavelength is 378 nm, a half value width (FWHM) is about 9 nm and emission hardly occurs near at a wavelength of 500 nm. In contrast, the spectrum of the embodiment indicates that there is an emission peak wavelength (peak wavelength at the maximum intensity) near at 500 nm (blue-green), a half value width of this peak is about 100 nm, and a peak near at a wavelength of 378 nm is very weak.

It has been found that by growing a ZnO layer while radiating S, a ZnO layer can be formed which has an emission peak wavelength near at 500 nm (e.g., in a range from 490 nm or longer and 510 nm or shorter) longer than the wavelength 378 nm corresponding to a band gap of ZnO, and a PL spectrum having a broad half value width (e.g., 50 nm or wider).

Consider at what degree a transition energy corresponding to an emission peak wavelength becomes narrow relative to a band gap of ZnO as S is doped. Division of an emission peak wavelength represented by a nm unit by 1240 can estimate a transition energy in an eV unit.

An emission peak wavelength of ZnO not doped with impurities is 378 nm corresponding to a band gap of 3.28 eV. An emission peak wavelength of ZnO doped with S is 500 nm corresponding to a transition energy of 2.48 eV. An emission peak wavelength of 490 nm corresponds to a transition energy of 2.53 eV, and an emission peak wavelength of 510 nm corresponds to a transition energy of 2.43 eV.

An emission peak wavelength corresponding to a transition energy (3.28 eV−0.6 eV=2.68 eV) narrower by 0.6 eV than a band gap of ZnO is 463 nm, whereas an emission peak wavelength corresponding to a transition energy (3.28 eV−0.7 eV=2.58 eV) narrower by 0.7 eV is 481 nm. It is therefore possible to estimate that as S is doped, a transition energy is obtained which is narrower by 0.7 eV or larger (at least 0.6 eV or larger) than that of ZnO not doped with impurities.

In this experiment, an S concentration of the ZnO layer was 0.1 atom % or smaller (an EDX detection sensitivity or smaller) for both the embodiment and comparative example. Namely, the ZnO layer of the embodiment contained a very small amount of S to the extend that EDX composition analysis could not detect.

Next, with reference to FIG. 3, description will be made on the experiment of measuring PL spectra of samples formed by the above-described embodiment method at different ZnO layer forming temperatures of 700° C., 500° C. and 300° C. A beam amount of ZnS was set to $1\times10^{15}$ atoms/cm$^2$s for each sample. An S concentration in each ZnO layer changed with the film forming temperatures of 700° C., 500° C. and 300° C., under the condition of a constant beam amount of ZnO. S concentrations of the samples formed at the film forming temperatures of 700° C., 500° C. and 300° C. were 0.1 atom % or smaller (detection sensitivity or lower), 0.5 atom % and 2 atom %, respectively, through EDX composition analysis.

Figure 3:
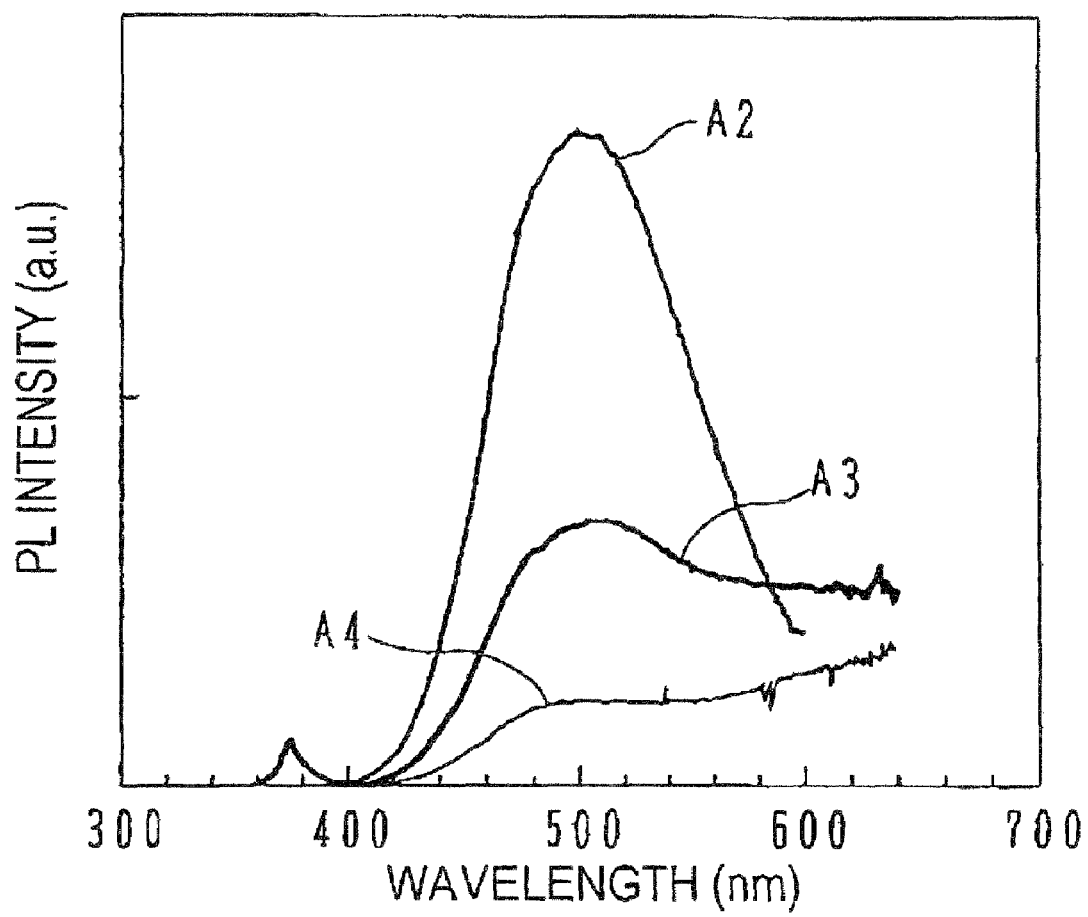
FIG. 3 is a graph representing PL spectra of ZnO layers formed at different temperatures.

Curves A2, A3 and A4 in FIG. 3 indicate spectra at film forming temperatures of 700° C. (S concentration of 0.1 atom % or smaller), 500° C. (S concentration of 0.5 atom %) and 300° C. (S concentration of 2 atom %), respectively.

Similar to the embodiment sample illustrated in FIG. 2, the sample at the film forming temperature of 700° C. (S concentration of 0.1 atom % or smaller) has a strong peak at a wavelength near at 500 nm and a weak peak near at a band gap (378 nm) of ZnO. In contrast, although the sample at the film forming temperature of 500° C. (S concentration of 0.5 atom %) has a peak at a wavelength near at 500 nm, this peak intensity is weak, and broad emission occurs near at 600 nm which may be ascribed to crystal defects, and the peak near at the band gap of ZnO disappears.

For the sample at the film forming temperature of 300° C. (S concentration of 2 atom %), an emission intensity at a wavelength near at 500 nm weakens further, a clear peak disappears, and a broad emission intensity near at 600 nm becomes stronger than at 500 nm. A peak near at the band gap of ZnO disappears.

It was studied whether this change in the optical characteristics depended on a change in the film forming temperature or in the S concentration. For the studies, PL spectra were compared between ZnO layers grown at ZnS beam amounts of $2\times10^{14}$ atoms/cm$^2$s and $1\times10^{15}$ atoms/cm$^2$s at a fixed film forming temperature of 500° C.

An S concentration of the ZnO layer formed at the ZnS beam amount of $2\times10^{14}$ atoms/cm$^2$s was 0.1 atom % or smaller (detection sensitivity or smaller) by EDX composition analysis. As described with reference to FIG. 3, an S concentration of the ZnO layer formed at the ZnS beam amount of $1\times10^{15}$ atoms/cm$^2$s and a film forming temperature of 500° C. is 0.5 atom %.

Figure 4:
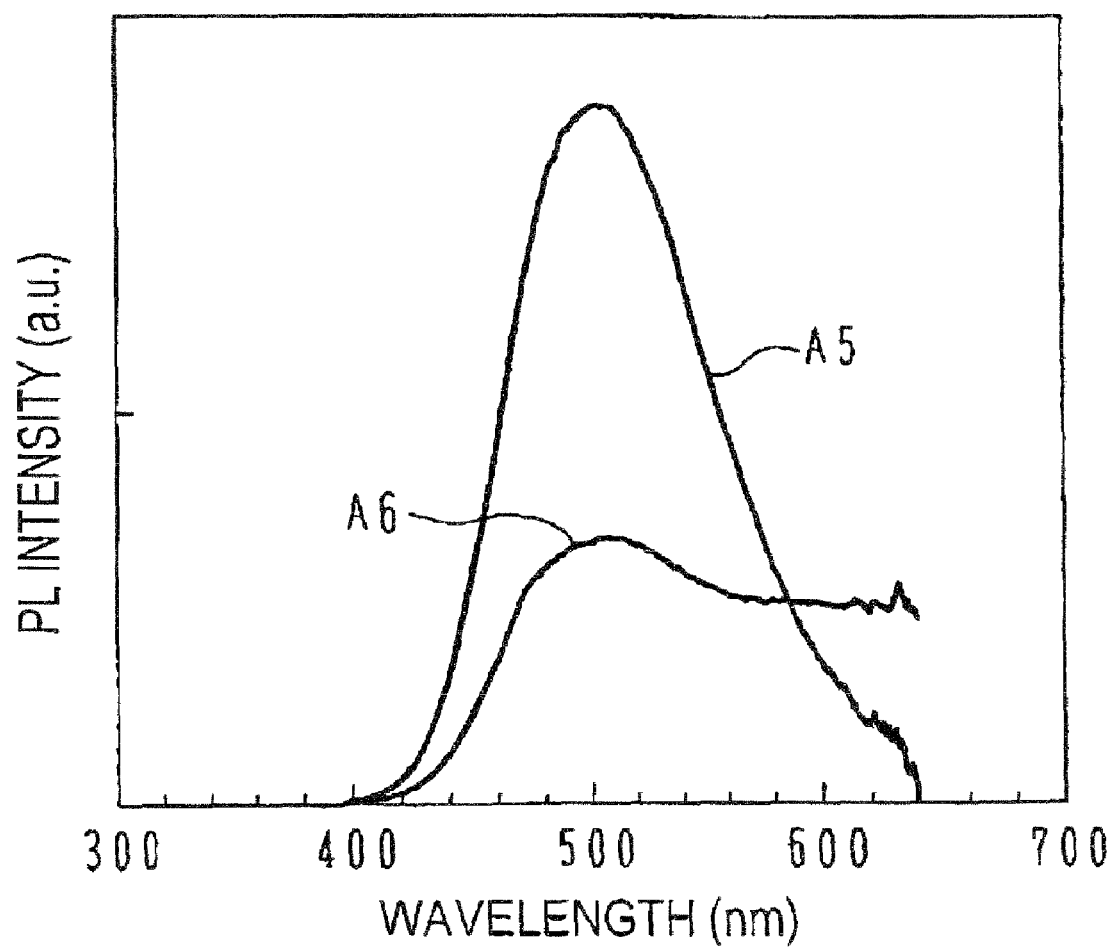
FIG. 4 is a graph representing PL spectra of ZnO layers formed at different amounts of ZnS beams.

FIG. 4 illustrates PL spectra of these samples. Curves A5 and A6 indicate spectra at an S concentrations of 0.1 atom % and an S concentration of 0.5 atom %, respectively. Both samples formed at the same film forming temperature have peaks at a wavelength near at 500 nm.

However, the sample at the S concentration of 0.1 atom % or smaller has a much stronger peak intensity than that of the sample at the S concentration of 0.5 atom %, and has a PL spectrum similar to that of the sample at the growth temperature of 700° C. and an S concentration of 0.1 atom % illustrated in FIG. 3. Namely, the optical characteristics of a ZnO layer change with not a film forming temperature but an S concentration.

If an S concentration is 0.1 atom % or smaller, it may regard that S is contained in the ZnO layer as impurities. If an S concentration is higher than 0.1 atom %, it may regard that S is contained in the ZnO layer to the extent that S changes a composition of the ZnO layer. An S concentration at 0.1 atom % or smaller is called an impurity level concentration, whereas an S concentration higher than 0.1 atom % is called a composition level concentration.

It can be understood from the experiments described with reference to FIGS. 3 and 4 that as S is doped at a composition level concentration, a peak intensity near at 500 nm lowers, a peak intensity near at a band gap of ZnO lowers also, and broad emission near at 600 nm to be ascribed to crystal defects increases. This may be considered that non luminescent centers are induced. If an S concentration is lower than 0.5 atom %, a spectrum having a clear peak near at 500 nm can be obtained even at a composition level concentration of S.

In order to obtain strong emission at a wavelength near at 500 nm and suppress broad emission near at 600 nm, it is preferable to dope S into the ZnO layer at an impurity level concentration (0.1 atom % or smaller). It is considered that a lower limit value of a preferable S concentration is 0.0001 atom %. At an S concentration lower than the lower limit value, emission near at 500 nm becomes too weak, and most of emission is at 378 nm inherent to ZnO. It can be considered that by doping S at an impurity level concentration, emission of blue-green is realized by isoelectronic traps of a fine amount of doped S atoms, and that emission at a deep level caused by reduction in oxygen vacancy (Vo) or interstitial zinc ($I_{zn}$) and suppression of non luminescent centers are realized.

Isoelectronic traps correspond to a confined state of electrons or holes attracted because of different electron affinity relative to the original element (O) caused by replacement of a fine amount of doped element (S) having the same electron arrangement as that of elements (in this case, Zn and O) constituting semiconductor, at lattice points. Excitons in an excited state are trapped at levels formed by mixing S. Transition between this level and ground state forms emission at an energy lower than a band gap. Emission by isoelectronic traps can realize a high emission efficiency even at a high temperature, because motion of excitons by a temperature rise is restricted.

There is a tendency that the influence of isoelectronic traps reduces as an S concentration becomes too high. Although it is considered that the influence of isoelectronic traps exist even at an S concentration of 0.5 atom %, the influence is small because of an increase in the S concentration.

It is expected that by setting an S concentration in the ZnO layer to an impurity level concentration, it is possible to suppress an emission efficiency from being lowered by phase separation as in a green light emitting diode (LED) using InGaN.

It is also expected that by setting an S concentration to an impurity level concentration, it is possible to realize a green LED having a high emission efficiency, because since the composition is ZnO, a lattice mismatch factor of ZnO/Mg-ZnO of a double hetero structure or a quantum well structure is suppressed from becoming lower than an InGaN/GaN structure requiring a high In composition, and crystallinity is suppressed from being degraded by strain in the emission layer caused by lattice mismatch. Namely, it is expected that an emission efficiency is suppressed from being lowered by formation of a piezo electric field. It is expected that since a piezo electric field is not formed, emission color does not change, otherwise to be caused by a change in an applied voltage (drive current).

Figure 7:
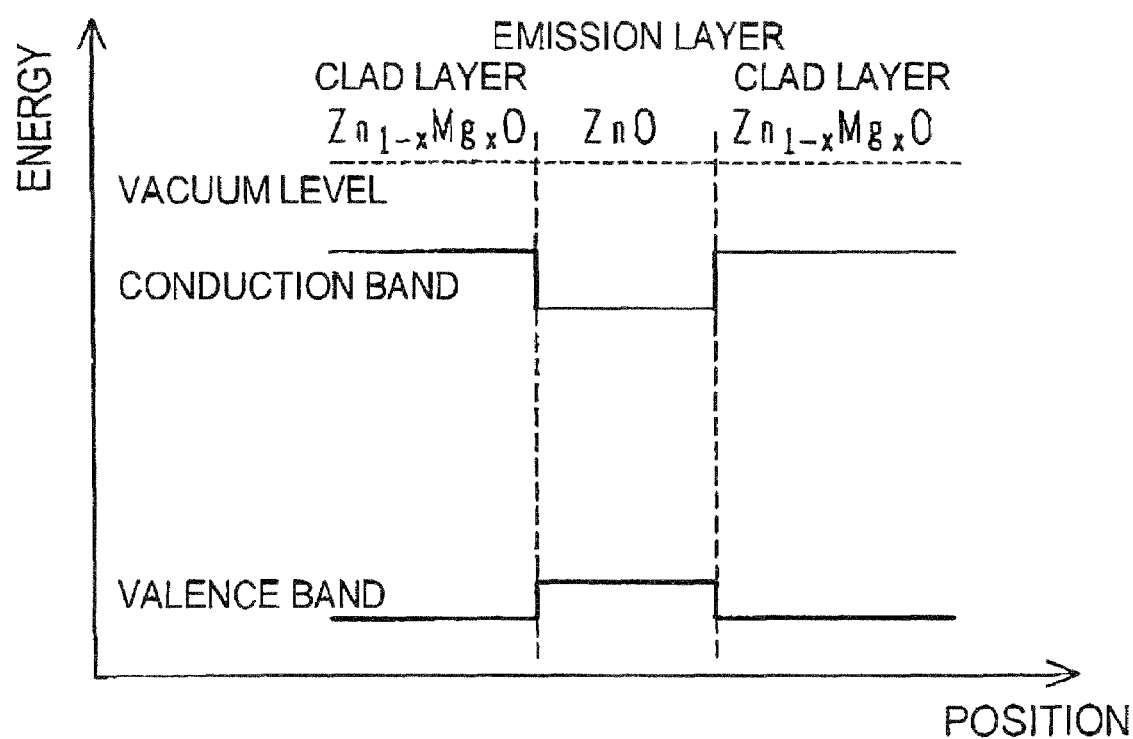
FIG. 7 is a band diagram of a double hetero structure of ZnMgO//ZnO/ZnMgO.
Figure 8:
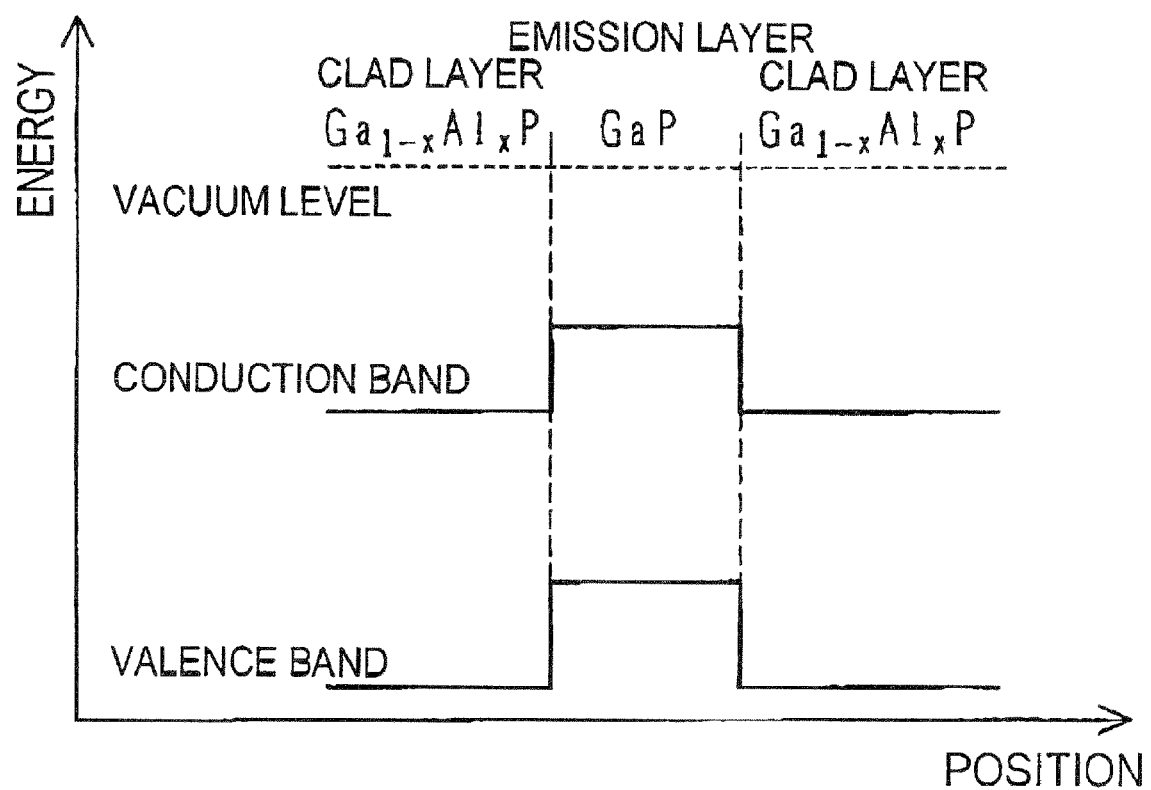
FIG. 8 is a band structure of a double hetero structure of GaAlP/GaP/GaAlP.

FIG. 7 is a band diagram of a double hetero structure of ZnMgO/ZnO/ZnMgO. A hetero junction of ZnO/MgZnO has a type I structure. Therefore, as a double hetero structure or a quantum well structure is formed, an emission efficiency can be improved by confining carriers in a ZnO emission layer.

Figure 5A:
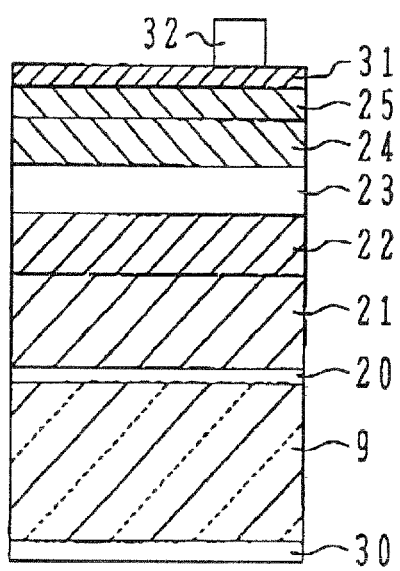
FIG. 5A is a schematic cross sectional view of a light emitting device according to a second embodiment.

Next, with reference to FIGS. 5A to 5C, description will be made on a manufacture method for a light emitting device according to the second embodiment. FIG. 5A is a schematic cross sectional view of a light emitting device of the second embodiment. The light emitting device contains the ZnO layer doped with S and described in the first embodiment, in an emission layer. The film forming system described with reference to FIG. 1 is used.

As a substrate 9 to be used for a crystal growth underlying layer, a ZnO substrate is used which has an n-type conductivity type and exposes a +c plane. A light emitting device is formed on the +c plane. First, a washed substrate 9 is held by a substrate heater 8, and the substrate surface is cleaned further by thermal annealing. Thermal annealing is performed, for example, 30 minutes at 900° C.

Next, an n-type ZnO buffer layer 20 is formed on the substrate 9 subjected to thermal annealing. The n-type ZnO buffer layer 20 is grown by radiating a Zn beam and an O radical beam at the same time to the substrate heated to 300° C. to 500° C., and annealing for about 30 minutes at 800° C. to 900° C. is performed. A thickness of the n-type ZnO buffer 20 is preferably about 10 nm to 30 nm.

Next, an n-type ZnO layer 21 doped with Ga is formed on the surface of the n-type ZnO buffer layer 20. The n-type ZnO layer 21 is grown by radiating a Zn beam, an O radical beam and a Ga beam at the same time to the substrate heated to 500° C. to 1000° C. A thickness of the n-type ZnO layer 21 is preferably 1 μm to 2 μm, and and a Ga concentration is preferably $1 \times 10^{18}$ cm$^{-3}$ or higher.

Next, an n-type $Zn_{1-x}Mg_xO$ ($0 \leq x \leq 1$) clad layer 22 doped with Ga is formed on the surface of the n-type ZnO layer 21. The n-type $Zn_{1-x}Mg_xO$ ($0 \leq x \leq 1$) clad layer 22 is grown by radiating a Zn beam, an O radical beam, if necessary an Mg beam, and a Ga beam at the same time to the substrate set to a temperature lower than a growth temperature of the n-type ZnO layer 21 in the range of 500° C. to 1000° C. A thickness of the n-type $Zn_{1-x}Mg_xO$ ($0 \leq x \leq 1$) clad layer 22 is preferably 100 to 600 nm, and a Ga concentration is preferably $1 \times 10^{18}$ cm$^{-3}$ or higher.

Next, an emission layer 23 is formed on the surface of the n-type $Zn_{1-x}Mg_xO$ ($0 \leq x \leq 1$) clad layer 22. The emission layer has a quantum well structure alternately laminating a ZnO layer (ZnO layer doped with S) of the first embodiment and a $Zn_{1-x}Mg_xO$ ($0 \leq x \leq 1$) layer. In order to use the ZnO layer doped with S as the well layer and the $Zn_{1-x}Mg_xO$ ($0 \leq x \leq 1$) layer as the barrier layer, x corresponding to the compositions of the barrier layer is determined.

Figure 5B:
FIGS. 5B and 5C are schematic cross sectional views illustrating examples of the structure of an emission layer.
Figure 5C:
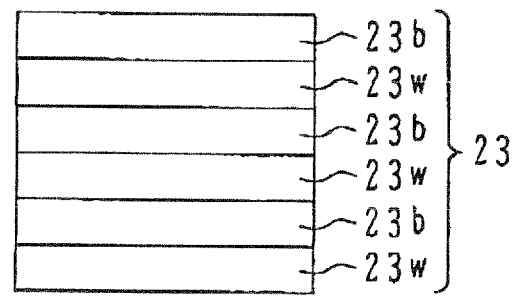

The emission layer 23 may have a structure laminating one barrier layer 23b on one well layer 23w as illustrated in FIG. 5B, or may have a multiple quantum well structure alternately laminating a well layer 23w and a barrier layer 23b a plurality of times.

The well layer 23w (ZnO layer doped with S) is grown by radiating a Zn beam, an O radical beam and a ZnS beam at the same time on the substrate heated to 500° C. to 1000° C. The barrier layer 23b ($Zn_{1-x}Mg_xO$ layer) is grown by radiating a Zn beam, an O radical beam, and (if necessary) an Mg beam at the same time to the substrate heated to 500° C. to 1000° C.

The emission layer 23 may be a single ZnO layer doped with S having a double hetero structure.

Next, a p-type $Zn_{1-x}Mg_xO$ ($0 \leq x \leq 1$) clad layer 24 doped with N is formed on the surface of the emission layer 23. The p-type $Zn_{1-x}Mg_xO$ ($0 \leq x \leq 1$) clad layer 24 is grown by radiating a Zn beam, an O radical beam, if necessary an Mg beam, and an N radical beam at the same time to the substrate heated to 500° C. to 1000° C. A thickness of the p-type $Zn_{1-x}Mg_xO$ ($0 \leq x \leq 1$) clad layer 24 is preferably 100 to 300 nm, and an N concentration is preferably $1 \times 10^{18}$ cm$^{-3}$ or higher. The p-type $Zn_{1-x}Mg_xO$ ($0 \leq x \leq 1$) clad layer 24 uniformly doped with N can be obtained.

In order to function as clad layers of the emission layer 23, x of the compositions of the n-type $Zn_{1-x}Mg_xO$ ($0 \leq x \leq 1$) clad layer 22 and x of the compositions of the p-type $Zn_{1-x}Mg_xO$ ($0 \leq x \leq 1$) clad layer 24 are determined.

Lastly, a p-type ZnO layer 25 doped with N is formed on the surface of the p-type $Zn_{1-x}Mg_xO$ ($0 \leq x \leq 1$) clad layer 24. The p-type ZnO layer is grown by radiating a Zn beam, an O radical beam and an N radical beam at He same time to the substrate heated to 500° C. to 1000° C. A thickness of the p-type ZnO layer 25 is preferably 100 nm to 200 nm, and an N concentration is preferably $1 \times 10^{19}$ cm$^{-3}$ or higher. The p-type ZnO layer 25 uniformly doped with N can be obtained.

Next, electrodes are formed. An n-side electrode 30 is formed on the bottom of substrate 9. The n-side electrode 30 is formed, for example, by forming a Ti layer having a thickness of 2 nm to 10 nm on the bottom of the substrate 9 and then laminating an Al layer having a thickness of 300 nm to 500 nm on the Ti layer.

A p-side electrode 31 is formed on the upper surface of the p-type ZnO layer 25. The p-side electrode 31 is formed, for example, by forming an Ni layer having a thickness of 0.5 nm to 1 nm on the p-type ZnO layer and then laminating an Au layer having a thickness of 10 nm on the Ni layer. A bonding electrode 32 is formed on the p-side electrode The bonding electrode 32 is made of, for example, an Au layer having a thickness of 500 nm.

After these electrodes are formed, an electrode alloying process is executed, for example, in an oxygen atmosphere at 400° C. to 800° C. An alloying process time is, for example, 1 to 10 minutes. With these processes, the light emitting device of the second embodiment is manufactured. Although a ZnO substrate having an n-type conductivity type is used as the substrate 9, a SiC substrate or a GaN substrate having an n-type conductivity may also be used.

Figure 6:
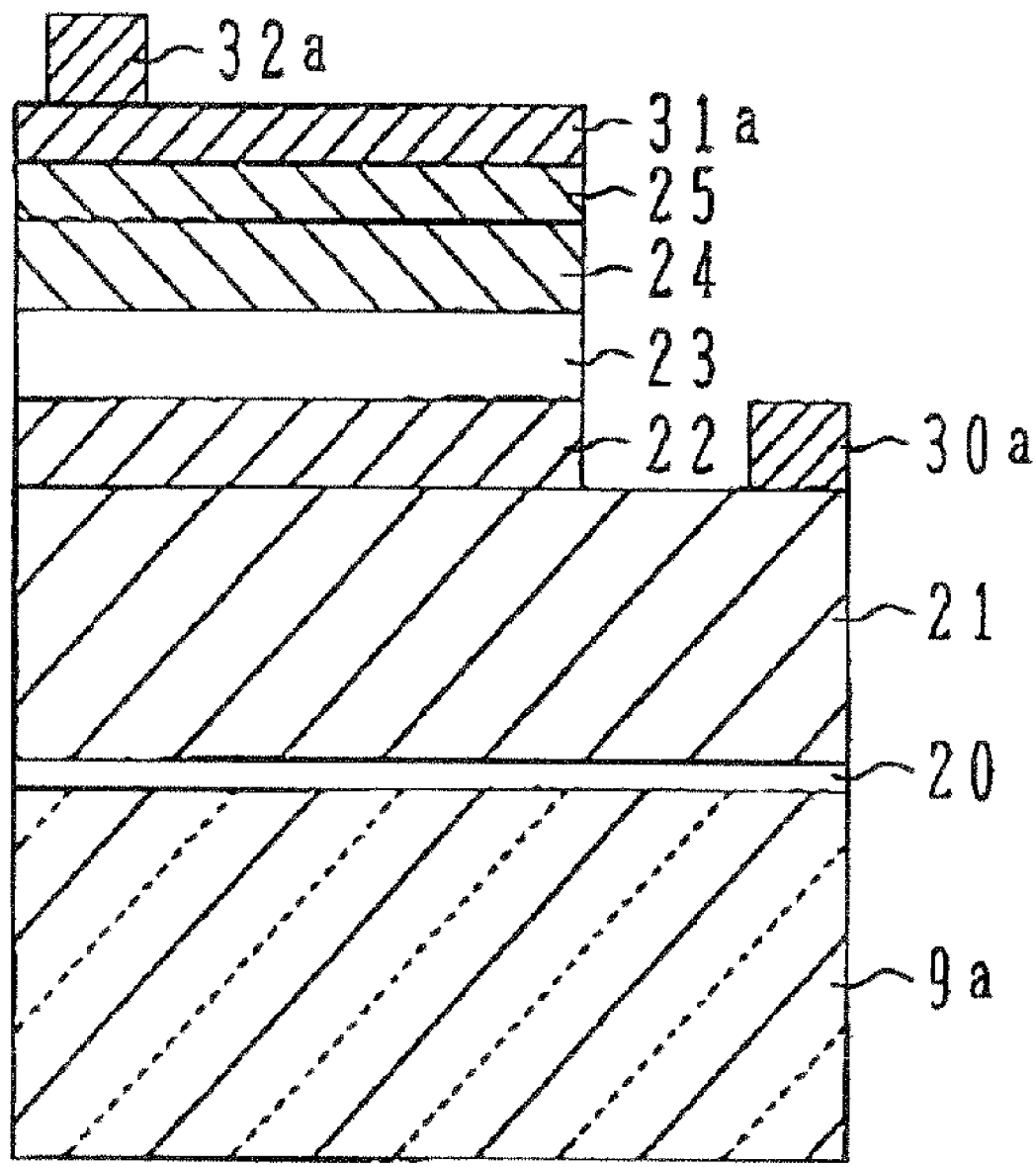
FIG. 6 is a schematic cross sectional view of a light emitting device according to a third embodiment.

Next, with reference to FIG. 6, description will be made on a method of manufacturing a light emitting device of the third embodiment. Different points from the second embodiment reside in that an insulating sapphire substrate 9a is used as the substrate 9, and an electrode forming process differs correspondingly.

Similar to the second embodiment, layers from the n-type ZnO buffer layer 20 to the p-type ZnO layer 25 are formed on and above the substrate 9a. A wafer formed with the layers up to the p-type ZnO layer is dismounted from the film forming system, and thereafter a resist film, a protective film or the like is formed and patterned to form an etching mask having a recess window in a region corresponding to the region where an n-side electrode is formed. By using this etching mask, the layers from the p-type ZnO layer 25 to n-type $Zn_{1-x}Mg_xO$ ($0 \leq x \leq 1$) clad layer 22 are etched, for example, by wet etching or reactive ion etching, to thereby expose the n-type ZnO layer 21.

Next, an n-side electrode 30a is formed by forming, for example, a Ti layer having a thickness of 2 nm to 10 nm on the surface of the exposed n-type ZnO layer and laminating an Al layer having a thickness of 300 nm to 500 nm on the Ti layer. After the n-side electrode 30a is formed, the etching mask is removed.

Next, a p-side electrode 31*a* is formed by forming, for example, an Ni layer having a thickness of 0.5 nm to 1 nm and laminating an Au layer having a thickness of 10 nm on the Ni layer. Further, a bonding electrode 32*a* made of, for example, an Au layer having a thickness of 500 nm is formed on the p-side electrode 31*a*. The p-side electrode 31*a* and bonding electrode 32*a* are formed by using proper masks so as not to deposit the materials of electrodes on the p-side on the n-side electrode 30*a*.

After these electrodes are formed, an electrode alloying process is executed, for example, in an oxygen atmosphere at 400° C. to 800° C. An alloying process time is, for example, 1 to 10 minutes. With these processes, the light emitting device of the third embodiment is manufactured.

As described in the second and third embodiments, it is possible to manufacture a ZnO-containing light emitting diode which contains the ZnO layer doped with a fine amount of S in the emission layer and has an emission peak wavelength near at 500 nm (i.e., blue-green).

In the above embodiments, although A ZnO layer doped with S and other layers are formed by MBE, a crystal growth method is not limited thereto. For example, metal organic chemical vapor deposition (MOCVD) may also be used. At a film forming temperature of 300° C. or higher, a ZnO layer having a desired S concentration can be formed.

In the above embodiments, a ZnO-containing semiconductor device is manufactured on a ZnO substrate, an SiC substrate, a GaN substrate, or a sapphire substrate. A ZnO-containing semiconductor device may be manufactured on a template substrate formed by forming a ZnO layer as a crystal growth underlying layer on a substrate made of material other than ZnO such as a sapphire substrate and an SiC substrate.

In the above embodiments, a manufacture method for a blue-green LED has been described. A blue-green laser diode (LD) may be manufactured by forming a cavity by cleavage. Products applying these devices may also be manufactured including various types of indicators, LED displays, and LD displays. Blue-green LED or LD may be used as a green light source of a projector RGB light source.

The present invention has been described in conjunction with the preferred embodiments. The present invention is not limited thereto. For example, it is obvious for those skilled in the art that various modifications, improvements, combinations and the like can be made.

What are claimed are:

1. A ZnO single crystal layer doped with S at a concentration of 0.1 atom % or smaller and having an emission peak wavelength in a measured photoluminescence spectrum in a range of 490 nm or longer and 510 nm or shorter.

2. The ZnO single crystal layer according to claim 1, wherein a half value width of an emission spectrum in said measured photoluminescence spectrum is 50 nm or wider and 100 nm or narrower.

3. A semiconductor light emitting device comprising:
a first semiconductor layer of a first conductivity type;
a second semiconductor layer of a second conductivity type opposite to said first conductivity type;
an emission layer sandwiched between said first and second semiconductor layers, said emission layer including a ZnO single crystal layer doped with S at a concentration of 0.1 atom % or smaller and having an emission peak wavelength in a measured photoluminescence spectrum in a range of 490 nm or longer and 510 nm or shorter;
a first electrode electrically connected to said first semiconductor layer; and
a second electrode electrically connected to said second semiconductor layer.

4. The semiconductor light emitting device according to claim 3, wherein a half value width of an emission spectrum in said measured photoluminescence spectrum is 50 nm or wider and 100 nm or narrower.

5. The semiconductor light emitting device according to claim 3, wherein said first semiconductor layer includes a first $Zn_{1-x}Mg_xO$ ($0 \leqq x \leqq 1$) layer of said first conductivity type, said second semiconductor layer includes a second $Zn_{1-x}Mg_xO$ ($0 \leqq x \leqq 1$) layer of said second conductivity type, and said emission layer includes said ZnO layer and has a double hetero structure that said ZnO layer is sandwiched between said first and second $Zn_{1-x}Mg_xO$ ($0 \leqq x \leqq 1$) layers.

6. The semiconductor light emitting device according to claim 3, wherein said emission layer has a quantum well structure alternately laminating a well layer made of said ZnO layer and a barrier layer made of a $Zn_{1-x}Mg_xO$ ($0 \leqq x \leqq 1$) layer at least once.

7. The semiconductor light emitting device according to claim 3, further comprising a support substrate of a substrate of any one of ZnO, SiC, GaN and sapphire or a template, and a structural body that said emission layer is sandwiched between said first and second semiconductor layers is formed above said support substrate.

8. The semiconductor light emitting device according to claim 7, wherein said support substrate is a ZnO substrate having a +c plane.

9. A ZnO-containing semiconductor light emitting device to be manufactured by a method comprising steps of:
growing a first ZnO single crystal layer of a first conductivity type on a substrate;
growing a ZnO single crystal emission layer above said first ZnO single crystal layer while radiating ZnS, said ZnO single crystal emission layer being doped with S at a concentration of 0.1 atom % or smaller and having an emission peak wavelength in a measured photoluminescence spectrum in a range of 490 nm or longer and 510 nm or shorter;
growing a second ZnO single crystal layer of a second conductivity type opposite to said first conductivity type above said ZnO single crystal emission layer;
growing a first electrode electrically connected to said first ZnO single crystal layer; and
growing a second electrode electrically connected to said second ZnO single crystal layer.

* * * * *